United States Patent

Sun et al.

[11] Patent Number: 6,147,013
[45] Date of Patent: Nov. 14, 2000

[54] METHOD OF LPCVD SILICON NITRIDE DEPOSITION

[75] Inventors: Pei-Feng Sun, KaoShiung; Ching-Cheng Hsieh, TaoYuan; Chien-Hung Chen, YungHo; May-Jane Chen, Hsin Chuang, all of Taiwan

[73] Assignee: Mosel Vitelic Inc., Hsinchu, Taiwan

[21] Appl. No.: 09/236,577

[22] Filed: Jan. 26, 1999

[30] Foreign Application Priority Data

Sep. 21, 1998 [TW] Taiwan ................................. 87115675

[51] Int. Cl.⁷ ................................................. H01L 21/31
[52] U.S. Cl. .......................................... 438/791; 438/791
[58] Field of Search .................................... 438/791, 792, 438/793, 794, 787, 954

[56] References Cited

U.S. PATENT DOCUMENTS

| | | | |
|---|---|---|---|
| 5,663,087 | 9/1997 | Yokozawa | 438/791 |
| 5,888,579 | 3/1999 | Lun | 438/791 |
| 5,939,333 | 8/1999 | Hurlet et al. | 438/791 |
| 5,981,404 | 11/1999 | Sheng et al. | 438/791 |

*Primary Examiner*—David Nelms
*Assistant Examiner*—Dung A Le
*Attorney, Agent, or Firm*—Bacon & Thomas, PLLC

[57] ABSTRACT

A method of LPCVD silicon nitride deposition for decreasing particles is disclosed. First, a silicon nitride layer is formed on a semiconductor substrate by LPCVD. Next, low gas flow rate purging step and cycle purging step are executed sequentially. Finally, the semiconductor substrate is taken out from the LPCVD tube. The key point of this invention is decreasing the gas flow rate of purging and cycle purging by inputting nitrogen gas slowly. Thereby the substrate surface contamination problem induced by conventional method can be avoided.

15 Claims, 2 Drawing Sheets

METHOD OF LPCVD SILICON NITRIDE DEPOSITION

BACKGROUND OF THE INVENTION

1. Field of the Invention

The present invention relates to a method of fabricating an integrated circuit, and more particularly to a method of LPCVD (Low Pressure Chemical Vapor Deposition) silicon nitride deposition for decreasing particles.

2. Description of the Prior Art

Silicon nitride ($Si_3N_4$) is a general dielectric material used in a semiconductor manufacturing process. Its primary application is to be a mask for silicon oxide ($SiO_2$) etching. The silicon nitride mask property prevent oxidation of active regions on the substrate surface by its with respect to the of difficult oxygen penetration. The above description is process of LOCOS (Local Oxidation of Silicon). Besides the above application, silicon nitride has been provided to be a passivation of a semiconductor device by its property of difficult water penetration and alkali metal ions prevention. Because of having two different applications, silicon nitride is deposited by LPCVD (Low Pressure Chemical Vapor Deposition) or PECVD (Plasma Enhanced Chemical Vapor Deposition) according to its required characteristics.

An LPCVD reactor has an operating pressure less than 1 torr (0.2~0.5 torr is the best). Thereby a film deposited by LPCVD will have a good ability of step coverage.

FIG. 1 shows a Tubular Type LPCVD reactor, which is a hot wall reactor, built from annealed quartz 2. A set of heater elements 4 called Five Zone Heater is located around the quartz tube 2. The reactants are input from the tube bottom inlet 6 into inner tube. The silicon wafer in a quartz boat is positioned to a proper position for deposition. And the exhaust gases are output from the exit 10 by a pumping system.

In the process of silicon nitride deposition through low pressure method, a silicon nitride film is usually deposited in a tube with high temperature for increasing deposition rate. After the deposition step, the tube is still under low pressure. Therefore, before removing the silicon wafer with a silicon nitride film from the tube, the tube has to be input clean inert gas (Ar, $N_2$) from bottom inlets 6 and 8 for purging step and cycle purging step to remove dangerous gases inside the tube. And then the inner tube pressure is balanced with the environment pressure for removing silicon wafer easily. Typically, the input gas usually has a high gas flow rate of more than 1 L/min for decreasing the time of the cycle purging step. Thereby the process time inside the tube is decreased to improve efficiency. However, the high flow rate gas for cycle purging step has a lower temperature which will suddenly cool the hot wall of the tube. As a result, the silicon nitride film near the wall will delaminate to induce silicon nitride particles which would be blown to the surface of the silicon wafer. After a new reclean tube runs a process for 15 times, the amount of particles described above will rapidly increase to 100 (for the particle size about 0.2 microns), which is a big problem of product yield. A method of wet brush has been applied for decreasing particles, but a stress between the silicon nitride film and the substrate under it will be induced to make a bad effect in the following steps of exposure and development. Therefore, the conventional method of wet brush is not an efficient solution for the mentioned problem.

In order to solve the above problem and improve product yield, the present invention discloses a method of LPCVD silicon nitride deposition for decreasing particles by decreasing the gas flow rate in the cycle purging step. Thereby the silicon wafer surface contamination problem induced by conventional process can be avoided.

SUMMARY OF THE INVENTION

According, it is a primary object of the present invention to provide a method of LPCVD silicon nitride deposition for decreasing silicon nitride particles by decreasing the gas flow rate of cycle purging step.

It is another object of the present invention to provide a method of LPCVD silicon nitride deposition for decreasing particles to improve the substrate surface contamination problem induced by silicon nitride particles.

Yet, it is another object of the present invention to provide a method of LPCVD silicon nitride deposition for decreasing particles to improve the quality and yield of LPCVD silicon nitride layer.

These objects are accomplished by the fabrication process described below. First, a silicon nitride layer is formed on a semiconductor substrate by using LPCVD. Next, low gas flow rate purging step and cycle purging step are executed sequentially. Finally, the semiconductor substrate is taken out from the LPCVD tube.

The key point of the present invention is decreasing the gas flow rate in purging and cycle purging steps by inputting nitrogen gas slowly. Because in the conventional process the silicon nitride film with high temperature is cooled suddenly by inputting high flow rate nitrogen gas, the silicon nitride film will peel due to different stresses between films. Thereby the peeling particles will be blown to the substrate surface by nitrogen gas to induce the problem of contamination. Therefore, decreasing the gas flow rate in cycle purging step can improve the substrate surface contamination problem induced by silicon nitride particles.

BRIEF DESCRIPTION OF THE DRAWINGS

The accompanying drawings for reference to the description of this invention, in which.

DETAILED DESCRIPTION OF THE PREFERRED EMBODIMENT

Following is an embodiment for detail describing the present invention of a method of LPCVD silicon nitride deposition for decreasing particles. The silicon nitride film formed by the method of this invention should be not only applied to IC process but also to other applications.

Figure 1:
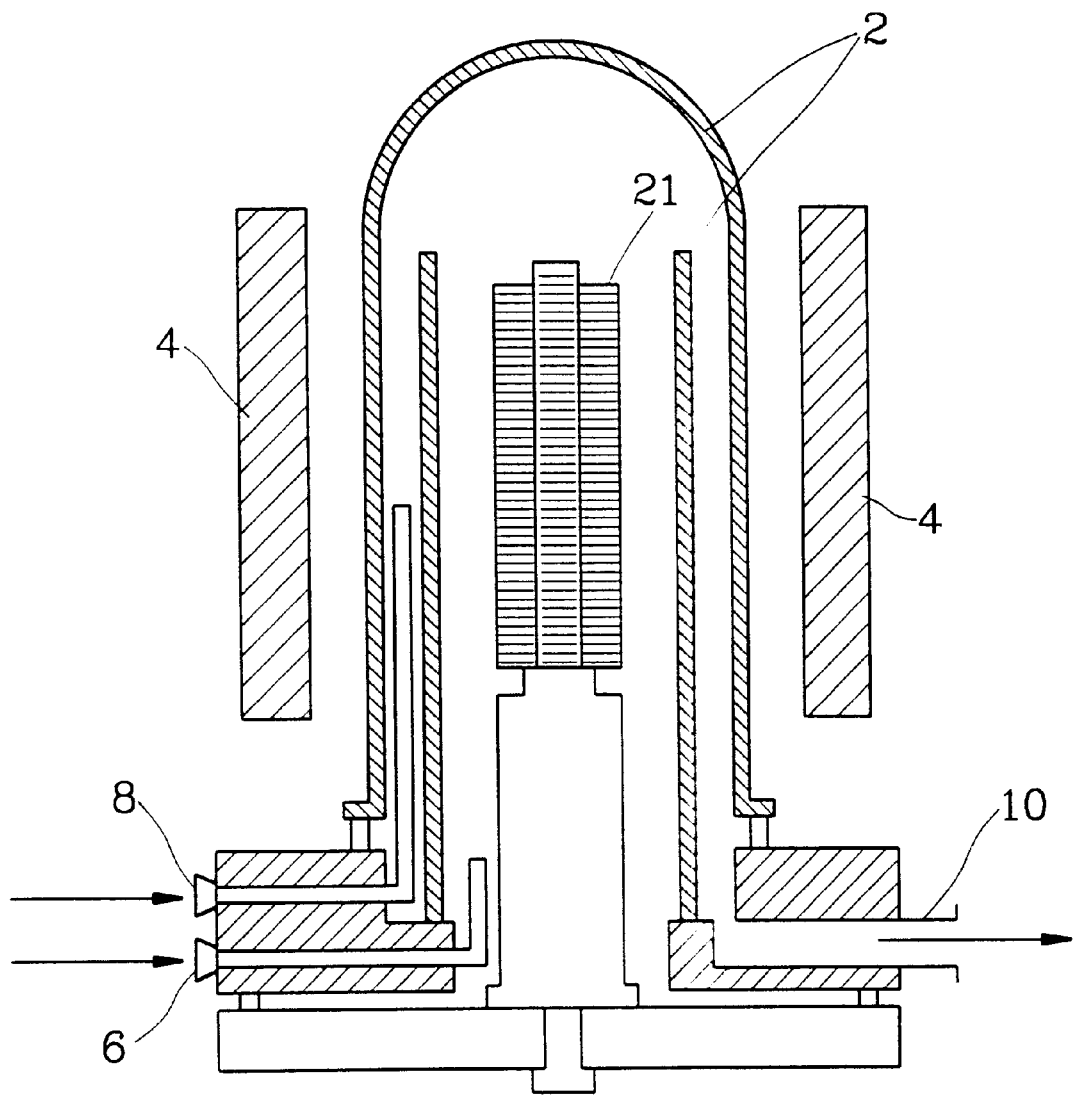
FIG. 1 is a cross-sectional view of an LPCVD tube according to an embodiment of the present invention.
Figure 2:
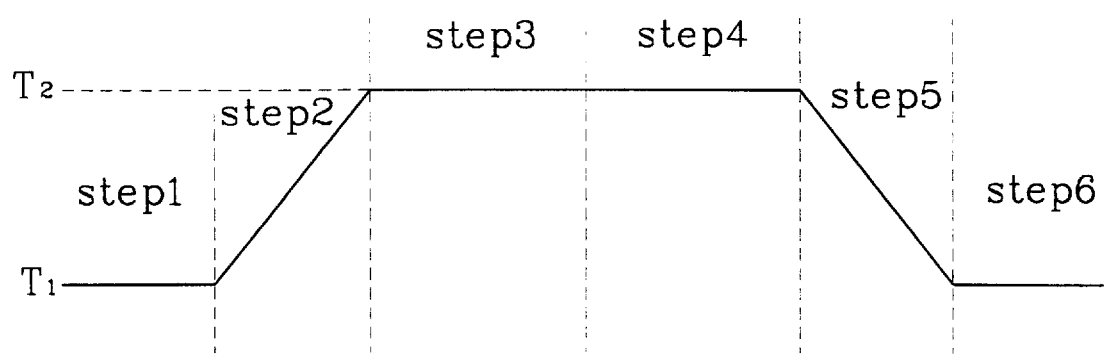
FIG. 2 is a curve of temperature versus time according to an embodiment of the present invention.

FIG. 2 is a curve of temperature versus time for forming an LPCVD silicon nitride film. Referring now to FIG. 2, step 1 is the step of sending a substrate into the reactor tube with a reactor pressure less than 1 torr (about 0.2~0.5 torr). Step 2 is the step of increasing temperature from standby temperature $T_1$, (about 650° C.) to reaction temperature $T_2$ (about 760 ° C.~800° C.). Then, step 3 is the step of silicon nitride pre-deposition in which the substrate surface grains will react with $NH_3$. During step 4, the reactant of $SiH_2Cl_2$ or mixture gas of $SiH_4$ and $NH_3$ is input into tube for depositing silicon nitride to required thickness.

The following step is the key of the present invention. During step 5, the temperature is gradually decreased from $T_2$ to standby temperature $T_1$. At the same time period, nitrogen gas or inert gas is input slowly with a flow rate less than 100 sccm. Thereby the silicon nitride film will not be peeled by input gas. Next, during step 6, a cycle purging step is executed through inputting nitrogen gas slowly with flow rates gradually increased from 500 sccm to 1000 sccm and finally to 2000 sccm. Thereby the contamination problem of peeling particles blown to the substrate surface will be avoided. Finally, the semiconductor substrate is taken out from the LPCVD tube at the atmosphere pressure. Then, the LPCVD silicon nitride deposition for decreasing particles is accomplished.

The LPCVD silicon nitride formed by the method provided in the present invention can decrease a large amount of particles on the substrate for obtaining a high quality silicon nitride film and improving the yield of IC devices.

It is to be understood that although the present invention has been described with reference to a particular preferred embodiment, it should be appreciated that numerous modifications, variations and adaptations may be made without departing from the scope of the invention as defined in the claims.

What is claimed is:

1. A method of LPCVD silicon nitride deposition for decreasing silicon nitride particles, comprising:
   (a) providing a semiconductor substrate;
   (b) positioning said semiconductor substrate in an LPCVD (Low Pressure Chemical Vapor Deposition) tube, and pumping the pressure of said LPCVD tube to a low pressure state;
   (c) forming a silicon nitride layer overlying the surface of said semiconductor substrate by inputting reactant;
   (d) sequentially executing a low flow rate nitrogen or inert gas purging step at a gas flow rate of about 100 sccm, followed by a cycle purging step with a gradually increasing gas flow rate from 500 sccm to 1000 sccm and to 2000 sccm;
   (e) taking said semiconductor substrate out from said LPCVD tube.

2. The method as recited in claim 1, wherein said low pressure state is less than 1 torr.

3. The method as recited in claim 1, wherein said low pressure state is between 0.2~0.5 torr.

4. The method as recited in claim 1, wherein said reactants is a mixture gas of $SiH_2Cl_2$ and $NH_3$.

5. The method as recited in claim 1, wherein said reactants is a mixture gas of $SiH_4$ and $NH_3$.

6. The method as recited in claim 1, wherein said nitrogen gas can be replaced by inert gas.

7. A method of LPCVD silicon nitride deposition for decreasing silicon nitride particles, comprising:
   (a) positioning a semiconductor substrate in an LPCVD (Low Pressure Chemical Vapor Deposition) tube, and pumping the pressure of said LPCVD tube to a low pressure state;
   (b) forming a silicon nitride layer overlying the surface of said semiconductor substrate by inputting reactant;
   (c) sequentially executing a low flow rate gas purging step at a gas flow rate of about 100 sccm, followed by a cycle purging step with a gradually increasing gas flow rate from 500 sccm to 1000 sccm and the to 2000 sccm;
   (d) taking said semiconductor substrate out from said LPCVD tube.

8. The method as recited in claim 7, wherein said low pressure state is less than 1 torr.

9. The method as recited in claim 7, wherein said low pressure state is between 0.2~0.5 torr.

10. The method as recited in claim 7, wherein said reactants is a mixture gas of $SiH_2Cl_2$ and $NH_3$.

11. The method as recited in claim 7, wherein said reactants is a mixture gas of $SiH_4$ and $NH_3$.

12. The method as recited in claim 11, wherein said gas is nitrogen gas.

13. The method as recited in claim 11, wherein said gas is inert gas.

14. The method as recited in claim 9, wherein said gas is nitrogen gas.

15. The method as recited in claim 9, wherein said gas is inert gas.

* * * * *